(12) United States Patent
Gu et al.

(10) Patent No.: US 10,976,866 B2
(45) Date of Patent: Apr. 13, 2021

(54) SHIFT-REGISTER CIRCUIT, GATE DRIVE CIRCUIT, LIQUID CRYSTAL DISPLAY AND TOUCH PANEL

(71) Applicants: HEFEI BOE OPTOELECTRONICS TECHNOLOGY CO., LTD., Anhui (CN); BOE Technology Group Co., Ltd., Beijing (CN)

(72) Inventors: Honggang Gu, Beijing (CN); Junsheng Chen, Beijing (CN); Xianjie Shao, Beijing (CN); Jie Song, Beijing (CN)

(73) Assignees: HEFEI BOE OPTOELECTRONICS TECHNOLOGY CO., LTD., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/616,958

(22) PCT Filed: Jan. 23, 2018

(86) PCT No.: PCT/CN2018/073792
§ 371 (c)(1),
(2) Date: Nov. 25, 2019

(87) PCT Pub. No.: WO2019/010952
PCT Pub. Date: Jan. 17, 2019

(65) Prior Publication Data
US 2020/0167055 A1    May 28, 2020

(30) Foreign Application Priority Data
Jul. 11, 2017 (CN) .......................... 201710561723.2

(51) Int. Cl.
*G06F 3/041* (2006.01)
*G09G 3/36* (2006.01)

(52) U.S. Cl.
CPC ....... *G06F 3/04184* (2019.05); *G09G 3/3677* (2013.01); *G09G 2310/0286* (2013.01)

(58) Field of Classification Search
CPC ... G11C 19/28; G06F 3/04184; G06G 3/3677; G09G 2310/0286; G09G 2330/06
See application file for complete search history.

(56) References Cited

U.S. PATENT DOCUMENTS 10,394,372 B2 *   8/2019   Gu ........................... G09G 3/20
10,622,081 B2 *   4/2020   Gu ........................ G11C 19/28
(Continued)

*Primary Examiner* — Christopher E Leiby
(74) *Attorney, Agent, or Firm* — Intellectual Valley Law, P.C.

(57) ABSTRACT

The present application discloses a shift-register circuit and driving method, a gate-driving circuit and display apparatus. The shift-register circuit includes an input sub-circuit, a reset sub-circuit, an output sub-circuit, a pull-down control sub-circuit, and a pull-down sub-circuit. The pull-down control sub-circuit is configured, after an output period of an operation cycle for displaying one frame of image, to control the pull-down node at a first voltage level to keep voltage level low at an output port. Additionally, the pull-down sub-circuit is configured, under control of power signals, to pull down the voltage level at the output port. For the display-touch panel with full-in-cell touch sensors, the voltage level at output port can be effectively reduced to avoid mutual interference between drive signals and touch-control signals.

8 Claims, 6 Drawing Sheets

(56) References Cited

U.S. PATENT DOCUMENTS

| | | | |
|---|---|---|---|
| 2008/0048712 A1* | 2/2008 | Ahn | H03K 17/161 |
| | | | 326/21 |
| 2015/0346904 A1* | 12/2015 | Long | G06F 3/04184 |
| | | | 345/174 |
| 2016/0225336 A1* | 8/2016 | Gu | G11C 19/28 |
| 2016/0268004 A1* | 9/2016 | Li | G09G 3/3648 |
| 2016/0274713 A1* | 9/2016 | Zhang | G06F 3/044 |
| 2016/0314850 A1* | 10/2016 | Gu | G11C 19/28 |
| 2016/0351159 A1* | 12/2016 | Yang | G11C 19/28 |
| 2016/0372063 A1* | 12/2016 | Li | G09G 3/3677 |
| 2017/0108989 A1* | 4/2017 | Gu | G06F 3/04184 |
| 2017/0199617 A1* | 7/2017 | Gu | G06F 3/04184 |
| 2017/0221441 A1* | 8/2017 | Gu | G09G 3/3677 |
| 2018/0107329 A1* | 4/2018 | Gu | G11C 19/28 |
| 2018/0190364 A1* | 7/2018 | Gu | G11C 8/04 |
| 2018/0204521 A1* | 7/2018 | Gu | G09G 3/3266 |

* cited by examiner

SHIFT-REGISTER CIRCUIT, GATE DRIVE CIRCUIT, LIQUID CRYSTAL DISPLAY AND TOUCH PANEL

CROSS-REFERENCE TO RELATED APPLICATION

This application is a national stage application under 35 U.S.C. § 371 of International Application No. PCT/CN2018/073792 filed Jan. 23, 2018, which claims priority to Chinese Patent Application No. 201710561723.2, filed Jul. 11, 2017, the contents of which are incorporated by reference in the entirety.

TECHNICAL FIELD

The present invention relates to display technology, more particularly, to a shift-register circuit, a gate-driving circuit having the shift-register circuit, and a display-touch panel thereof.

BACKGROUND

Display apparatus includes shift-register circuits (forming a gate-driving circuit) to drive each row of subpixel units for displaying image. The gate-driving circuit includes multiple shift-register units. Each shift-register unit is configured to provide a drive signal to one row of subpixel units and the multiple shift-register units cascaded in a series can provide multiple drive signals sequential scanning from one row to another to drive all subpixel units in the display apparatus to display one frame of image in each operation cycle.

For many state-of-art display apparatus, the display panel thereof is a display-touch panel integrating touch sensors for providing touch control function. Optionally, the display-touch panel can realize its touch control function by transmitting the touch-control signal through scanning. But the touch-control signal may cause mutual interference with the drive signal outputted from the shift-register unit, affecting both the touch-control function and image display effect.

SUMMARY

In an aspect, the present disclosure provides a shift-register circuit. The shift-register circuit includes an input sub-circuit coupled to an input port, a first power port, and a pull-up node. The input sub-circuit is configured to pull up a voltage level at the pull-up node under control of an input signal from the input port and a first power signal at a first voltage level from the first power port. The shift-register circuit further includes an output sub-circuit coupled to a first clock port, the pull-up node, and an output port. The output sub-circuit is configured to output a first clock signal from the first clock port to the output port under control of the voltage level at the pull-up node. Additionally, the shift-register circuit includes a reset sub-circuit coupled to a reset port, a second power port, and the pull-up node. The reset sub-circuit is configured to reset the voltage level at the pull-up node based on a reset signal from the reset port and a second power signal at a second voltage level from the second power port. Furthermore, the shift-register circuit includes a pull-down control sub-circuit coupled to the pull-up node, a pull-down node, a third power port, a second clock port, and the first clock port. The pull-down control sub-circuit is configured to control a voltage level at the pull-down node based on the voltage level at the pull-up node, a third power signal at the second voltage level from the third power port, a second clock signal from the second clock port, and the first clock signal. Moreover, the shift-register circuit includes a pull-down sub-circuit coupled to the pull-down node, the pull-up node, the third power port, a switch power port, and the output port. The pull-down sub-circuit is configured to pull down the voltage level at the pull-up node and the output port under control of the third power signal at the second voltage level and a switch power signal from the switch power port.

Optionally, the shift-register circuit further includes a compensation sub-circuit coupled to the pull-up node, the pull-down node, the third power port, and the switch power port. The compensation sun-circuit is configured to compensate the voltage level of the pull-up node under control of the voltage level at the pull-down node, the third power signal, and the switch power signal.

Optionally, the pull-down control sub-circuit includes a first transistor, a second transistor, and a first capacitor. A gate of the first transistor is coupled to the pull-up node, a first electrode of the first transistor is coupled to the third power port, and a second electrode of the first transistor is coupled to the pull-down node. A gate and a first electrode of the second transistor are both coupled to the second clock port, and a second electrode of the second transistor is coupled to the pull-down node. A first electrode of the first capacitor is coupled to the first clock port and a second electrode of the first capacitor is coupled to the pull-down node.

Optionally, the compensation sub-circuit includes a third transistor, a fourth transistor, and a fifth transistor. A gate of the third transistor is coupled to the pull-down node, a first electrode of the third transistor is coupled to the third power port. A gate of the fourth transistor is coupled to the pull-up node, a first electrode of the fourth transistor is coupled to the switch power port. A gate of the fifth transistor is coupled to a second electrode of the third transistor and a second electrode of the fourth transistor, a first electrode of the fifth transistor is coupled to the switch power port, and a second electrode of the fifth transistor is coupled to the pull-up node.

Optionally, the pull-down sub-circuit includes a sixth transistor, a seventh transistor, and an eighth transistor. A gate of the sixth transistor is coupled to the pull-down node, a first electrode of the sixth transistor is coupled to the third power port, and a second electrode of the sixth transistor is coupled to the pull-up node. A gate of the seventh transistor is coupled to the pull-down node, a first electrode of the seventh transistor is coupled to the third power port, and a second electrode of the seventh transistor is coupled to the output port. A gate of the eighth transistor is coupled to the switch power port, a first electrode of the eighth transistor is coupled to the third power port, and a second electrode of the eighth transistor is coupled to the output port.

Optionally, the input sub-circuit includes a ninth transistor having a gate coupled to the input port, a first electrode coupled to the first power port, and a second electrode coupled to the pull-up node.

Optionally, the reset sub-circuit includes a tenth transistor having a gate coupled to the reset port, a first electrode coupled to the second power port, and a second electrode coupled to the pull-up node.

Optionally, the output sub-circuit includes an eleventh transistor and a second capacitor. A gate of the eleventh transistor is coupled to the pull-up node, a first electrode of the eleventh transistor is coupled to the first clock port, and a second electrode of the eleventh transistor is coupled to the output port. A first electrode of the second capacitor is coupled to the pull-up node and a second electrode of the second capacitor is coupled to the output port.

Optionally, each of the first transistor, the second transistor, the third transistor, the fourth transistor, the fifth transistor, the sixth transistor, the seventh transistor, the eighth transistor, the ninth transistor, the tenth transistor, the eleventh transistor is an N-type transistor, while the first voltage level is higher than the second voltage level.

In another aspect, the present disclosure provides a method of driving the shift-register circuit described herein in an operation cycle of a display panel for displaying one frame of image including at least a charging period, an output period, a reset period, a noise-reduction period. The method includes, in the charging period, providing a first power signal to the first power port, and receiving an input signal at the input port to control the input sub-circuit for outputting the first power signal from the first power port to the pull-up node. Additionally, the method includes, in the output period, providing a first clock signal to the first clock port, and maintaining a voltage level of the pull-up node at that of the first power signal to control the output sub-circuit for outputting the first clock signal from the first clock port to the output port. Furthermore, the method includes, in the reset period, providing a second power signal to the second power port, and receiving a reset signal at the reset port to control the reset sub-circuit for outputting the second power signal from the second power port to the pull-up node. Moreover, the method includes, in the noise-reduction period, providing a third power signal to the third power port; maintaining a voltage level of the pull-up node at that of the second power signal, and providing a first clock signal to the first clock port and a second clock signal to the second clock port to control the pull-down control sub-circuit for maintaining the pull-down node at a first voltage level to further control the pull-down sub-circuit for respectively outputting the third power signal to the pull-up node and the output port.

Optionally, the shift-register circuit further includes a compensation sub-circuit and the operation cycle further includes a first touch-scan period before the output period. The method further includes, in the first touch-scan period, providing a switch power signal at the first voltage level to control the pull-down sub-circuit for outputting the third power signal at a second voltage level to the output port and to control the compensation sub-circuit for outputting the switch power signal to the pull-up node to maintain the pull-up node at the first voltage level.

Optionally, the operation cycle further includes a second touch-scan period after the noise-reduction period. The method further includes, in the second touch-scan period, providing the switch power signal at the first voltage level from the switch power port to control the pull-down sub-circuit for outputting the third power signal at the second voltage level to the output port.

Optionally, the first voltage level is a high voltage level relative to the second voltage level.

Optionally, the method further includes receiving a touch-control signal in a first touch-scan period for performing a touch-control function on the display panel with the operation cycle in frequency equal to or greater than 60 Hz.

Optionally, the method further includes receiving a touch-control signal in the second touch-scan period for performing a touch-control function on the display panel with the operation cycle in a scanning frequency of 60 Hz.

In yet another aspect, the present disclosure provides a gate-driving circuit including multiple shift-register units in a cascaded series. Each shift-register unit is a shift-register circuit described herein.

In still another aspect, the present disclosure provides a display-touch panel. The display-touch panel includes touch sensors embedded full-in-cell. Additionally, the display-touch panel includes a gate-driving circuit described herein for displaying one frame of image in an operation cycle with a scanning frequency and performing a touch-control in a touch-scan period within each operation cycle before an output period.

In still yet another aspect, the present disclosure provides a display apparatus including a display-touch panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
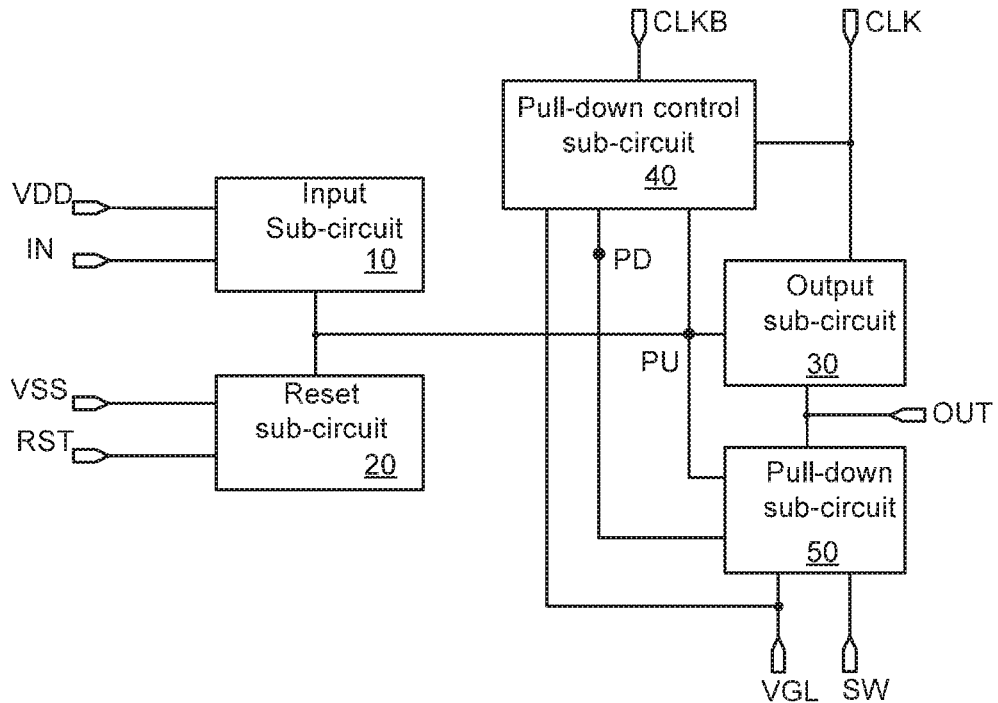
FIG. 1 is a block diagram of a shift-register circuit according to some embodiments of the present disclosure.

Accordingly, the present disclosure provides, inter alia, a shift-register circuit, a method of driving the shift-register circuit, a gate-driving circuit having the same, a display-touch panel having the gate-driving circuit, and a display apparatus thereof that substantially obviate one or more of the problems due to limitations and disadvantages of the related art. In one aspect, the present disclosure provides a shift-register circuit according to an embodiment of the present disclosure. FIG. 1 shows a block diagram of the shift register circuit including an input sub-circuit 10, a reset sub-circuit 20, an output sub-circuit 30, a pull-down control sub-circuit 40, and a pull-down sub-circuit 50. Referring to FIG. 1, the input sub-circuit 10 is coupled to an input port IN, a first power port VDD, a reset port RST, a second power port VSS, and a pull-up node PU. In the embodiment, the input sub-circuit 10 is configured to pull up a voltage level at the pull-up node under control of an input signal from the input port IN and a first power signal from the first power port VDD. The reset sub-circuit 20 is configured to reset the voltage level at the pull-up node under control of a reset signal from the reset port RST and a second power signal from the second power port VSS.

Referring to FIG. 1, the output sub-circuit 30 is coupled to the first clock port CLK, the pull-up node PU, and the output port OUT. In the embodiment, the output sub-circuit 30 is configured to output a first clock signal from the first clock port CLK to the output port OUT under control of the voltage level at the pull-up node PU.

Referring to FIG. 1, the pull-down control sub-circuit 40 is coupled to the pull-up node PU, a pull-down node PD, a third power port VGL, a second clock port CLKB, and the first clock port CLK. In the embodiment, the pull-down control sub-circuit is configured to control a voltage level at the pull-down node PD under control of the voltage level at the pull-up node PU, a third power signal from the third power port VGL, a second clock signal from the second clock port CLKB.

Optionally, the pull-down control sub-circuit 40 is configured, when the voltage level at the pull-up node PU is set to a first voltage level, to output a third power signal at a second voltage level from the third power port to the pull-down node PD, to pull down voltage level thereof. Optionally, the pull-down control sub-circuit 40 is configured, when the second clock signal provided to the second clock port is set to the first voltage level, to output the second clock signal to the pull-down node PD, to pull up the voltage level thereof. Additionally, the pull-down control sub-circuit 40 is configured, when the first clock signal is set to the first voltage level, to maintain the voltage level of the pull-down node PD at the first voltage level. In the embodiment, the first clock signal and the second clock signal are complementary, i.e., with a same frequency but out of phase (phase difference of 180 degrees).

Referring to FIG. 1, the pull-down sub-circuit 50 is coupled to the pull-down node PD, the pull-up node PU, the third power port VGL, a switch power port SW, and the output port OUT. In the embodiment, the pull-down sub-circuit 50 is configured to keep the voltage level at the pull-up node PU and the output port OUT low under control of the voltage level at the pull-down node PD, the third power signal from the third power port, and a switch power signal from the switch power port SW.

As seen, the shift-register circuit shown in FIG. 1 is configured, under alternate controls of the first clock signal and the second clock signal, to keep the voltage level at the pull-down node PD at the first voltage level (i.e., a switch-on voltage level, or an effective voltage level for turning on a corresponding transistor). As a result, the pull-down sub-circuit is able, under the control of the first voltage level at the pull-down node PD, to perform a noise-reduction operation to the pull-up node PU and the output port OUT. This noise-reduction operation can be performed every time after an output period in each operation cycle. For an operation scheme of a display-touch panel configured with the shift-register circuit and with touch-control signals being introduced between any two frames of images, the noise-reduction operation can effectively reduce interference to the touch-control signals. For another operation scheme of a display-touch panel configured with the shift-register circuit and with touch-control signals being inserted during one frame of image, the noise-reduction operation can be performed by directly setting power signal from the power port to a switch-off voltage level applied to the output port. This also effectively prevents mutual interference between the drive signal and the touch-control signal, improving touch-control function and image display quality of the display-touch panel.

Figure 2:
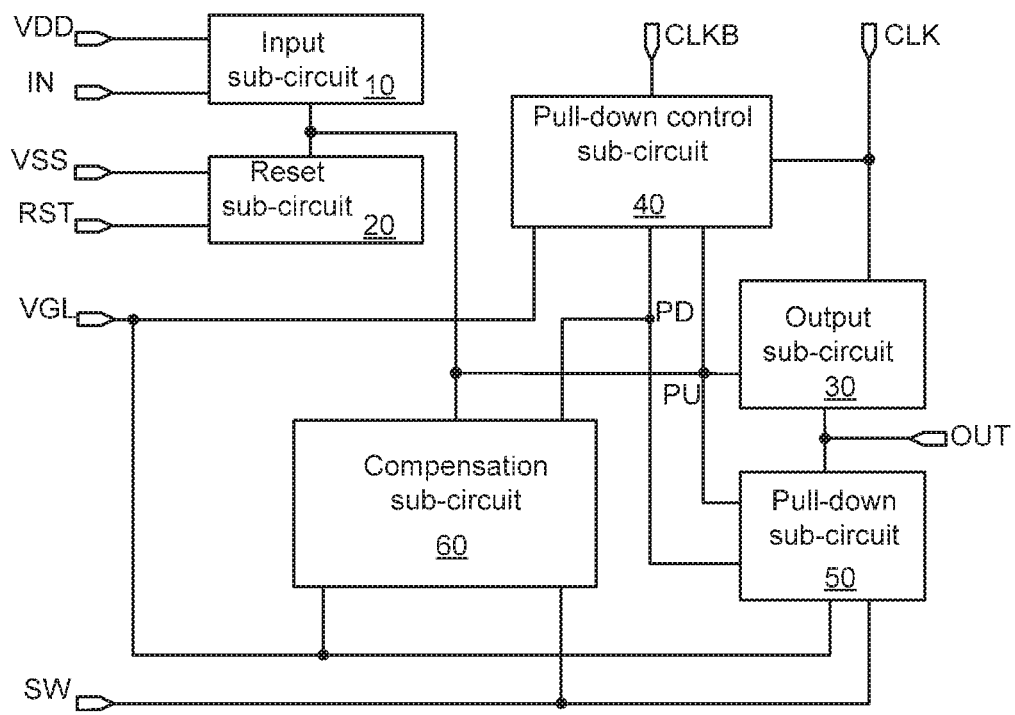
FIG. 2 is a block diagram of a shift-register circuit according to some embodiments of the present disclosure.

FIG. 2 is a block diagram of a shift-register circuit according to some embodiments of the present disclosure. Referring to FIG. 2, the shift-register circuit further includes a compensation sub-circuit 60. The compensation sub-circuit 60 is coupled to the pull-up node PU, the pull-down node PD, the third power port VGL, and the switch power port SW. In the embodiment, the compensation sub-circuit 60 is configured to compensate the voltage level at the pull-up node PU under control of the voltage levels at the pull-down node PD, the third power port, and the switch power port.

In a display-touch panel, the touch-control signals can be inserted in at least two ways: one is to provide or detect touch-control signals in a interval between displaying to frames of images; another one is to introduce the touch-control signal during scanning one frame of image. For the second way, when the touch-control signal is introduced, leakage currents may exist in the transistors in the shift-register circuit that are coupled to the pull-up node PU to cause the voltage level at the pull-up node PU to drop. After the touch-control signal is introduced, the shift-register circuit cannot properly output drive signal due to the drop of voltage level at the pull-up node PU. Therefore, it is necessary to use the compensation sub-circuit 60 to compensate the voltage level drop at the pull-up node PU.

Figure 3:
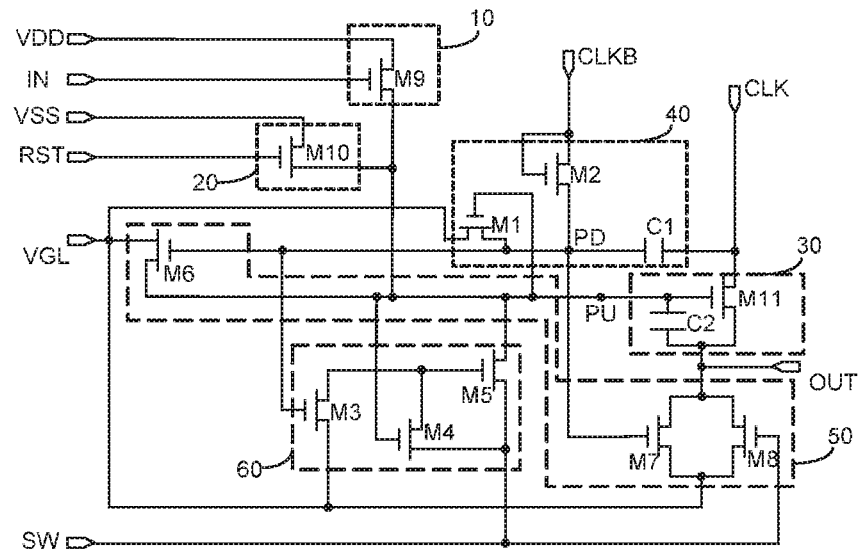
FIG. 3 is a block diagram of a shift-register circuit according to some embodiments of the present disclosure.

In particular, FIG. 3 shows a block diagram of a shift-register circuit according to some embodiments of the present disclosure. Referring to FIG. 3, the pull-down control sub-circuit 40 includes a first transistor M1, the second transistor M2, and a first capacitor C1. The first transistor M1 includes a gate coupled to the pull-up node PU, a first electrode coupled to the third power port VGL, and a second electrode coupled to the pull-down node PD. When the pull-up node PU is set to a first voltage level, e.g., a switch-on voltage level, the first transistor M1 is turned on to allow the third power signal from the third power port VGL to be transmitted to the pull-down node PD. The third power signal is provided at the second voltage level. Then the pull-down node PD is set to the second voltage level. When the transistors in the shift-register circuit are N-type transistors, the first voltage level is a high voltage level relative to the second voltage level. In this case, the third power signal at the third power port VGL is pulling down the voltage level at the pull-down node PD so that the pull-down sub-circuit 50, including a sixth transistor M6 and a seventh transistor M7, is turned off to avoid affection to the voltage level at the pull-up node PU and drive signal outputted from the output port OUT.

Referring to FIG. 3, the second transistor M2 includes a gate and a first electrode commonly coupled to the second clock port CLKB and a second electrode coupled to the pull-down node PD. When the second clock signal from the second clock port is set to the first voltage level, the second transistor M2 is able to output the second clock signal to the pull-down node PD so as to pull down the voltage level at the pull-down node PD.

Referring to FIG. 3, the first capacitor C1 has one electrode coupled the first clock port CLK and another electrode coupled to the pull-down node PD. In the embodiment, the first capacitor C1 is configured to keep the voltage level at the pull-down node PD at the first voltage level under control of a first clock signal provided to the first clock port CLK.

In the embodiment, clock signals from the first clock port CLK and the second clock port CLKB are typically in a same frequency but opposite in phase. Therefore, the Under control of the first clock signal and the second clock signal, the second transistor M2 and the first capacitor C1 can be functioned to ensure that the pull-down node PD of the shift-register circuit to be kept at the first (or high) voltage level during a non-display touch-scan period. This (high) voltage level at the pull-down node PD can drive the sixth transistor M6 and the seventh transistor M7 in the pull-down sub-circuit 50 for pulling down a voltage levels at the pull-up node PU and the output port OUT. That additionally helps to avoid generating interference to the touch-control signals during the non-display touch-scan period or to the drive signals applied by different shift-register circuits to nearby rows of subpixel units.

Optionally, referring to FIG. 3, the compensation sub-circuit 60 includes a third transistor M3, a fourth transistor M4, and a fifth transistor M5. The third transistor M3 includes a gate coupled to the pull-down node PD, a first electrode coupled to the third power port VGL, and a second electrode coupled to a gate of the fifth transistor M5. The fourth transistor M4 includes a gate coupled to the pull-up node PU, a first electrode coupled to the switch power port SW, and a second electrode coupled to the gate of the fifth transistor M5. The fifth transistor M5 has a gate coupled respectively to the second electrode of the third transistor M3 and the second electrode of the fourth transistor M4. M5 also has a first electrode coupled to the switch power port SW and a second electrode coupled to the pull-up node PU. When the pull-up node PU is set to the first voltage level, the fourth transistor M4 is turned on. If at this time the switch power signal from the switch power port SW is also set at the first voltage level, the fifth transistor M5 is also turned on. The switch power port SW then can output the switch power signal (at the first voltage level) to the pull-up node PU to compensate the voltage level drop at the pull-up node PU mentioned earlier.

In a driving mode of the display-touch panel to scan through all rows of subpixel units for displaying one frame of image, when touch-control signals are introduced, the compensation sub-circuit 60 in the shift-register circuit of a working row (currently being scanned) can make compensation to the voltage level of the pull-up node PU thereof. But for the shift-register circuits in non-working rows (currently not being scanned yet), the switch power signal provided to the switch power port SW is set to the first voltage level so that the pull-down control sub-circuit 40 can keep the pull-down node at the first voltage level. Then the third transistor M3 in the compensation sub-circuit 60 is turned on. The first electrode of M3 is coupled to the third power port VGL. The second electrode of M3 is coupled to the gate of the fifth transistor M5. As the third power signal from VGL is set to the second (low) voltage level, the coupling between the switch power port SW and the pull-up node PU in the shift-register circuit in non-working rows are suppressed.

Referring to FIG. 3 again, the pull-down sub-circuit 50 includes the sixth transistor M6, the seventh transistor M7, and an eighth transistor M8. In the embodiment, the sixth transistor M6 includes a gate coupled to the pull-down node PD, a first electrode coupled to the third power port VGL, and a second electrode coupled to the pull-up node PU. The sixth transistor M6 is configured to pull down voltage level at the pull-up node PU (by setting it at the second voltage level) when the pull-down node PD is at the first voltage level. The seventh transistor M7 includes a gate coupled to the pull-down node PD, a first electrode coupled to the third power port VGL, and a second electrode coupled to the output port OUT. In the embodiment, the seventh transistor M7 is configured to pull down voltage level at the output port (by setting it at the second voltage level) when the pull-down node is at the first voltage level. The eighth transistor M8 includes a gate coupled to the switch power port SW, a first electrode coupled to the third power port VGL, and a second electrode coupled to the output port OUT. The eighth transistor M8 is configured to pull down the voltage level at the output port (by setting it to the second voltage level) when the switch power signal provided to the switch power port SW is set to the first voltage level.

Optionally, the input sub-circuit 10 includes a ninth transistor M9 and the reset sub-circuit 20 includes a tenth transistor M10. The ninth transistor M9 includes a gate coupled to the input port IN, a first electrode coupled to the first power port VDD, and a second electrode coupled to the pull-up node PU. In the embodiment, the ninth transistor M9 is configured to output a first power signal from the first power port VDD to the pull-up node PU under control of an input signal from the input port IN. The first power signal is set to the first voltage level so that the input sub-circuit 10 is able to pull up the voltage level at the pull-up node PU. The tenth transistor M10 includes a gate coupled to the reset port RST, a first electrode coupled to the second power port VSS, and a second electrode coupled to the pull-up node PU. The tenth transistor M10 is configured to output the second power signal from the second power port VSS to the pull-up node PU under control of a reset signal provided to the reset port RST. The second power port VSS is set to the second voltage level so that the pull-up node PU can be reset to a (low) second voltage level.

Optionally, the output sub-circuit 30 includes an eleventh transistor M11 and a second capacitor C2. The eleventh transistor M11 includes a gate coupled to the pull-up node PU, a first electrode coupled to the first clock port CLK, and a second electrode coupled to the output port OUT. In the embodiment, the eleventh transistor M11 is configured to output a first clock signal from the first clock port CLK to the output port OUT under control of the voltage level at the pull-up node PU. The first clock signal outputted from the output port OUT is used as a drive signal to drive a row of subpixel units in the display-touch panel. The second capacitor C2 has one electrode coupled to the pull-up node PU and another electrode coupled to the output port OUT.

Figure 4:
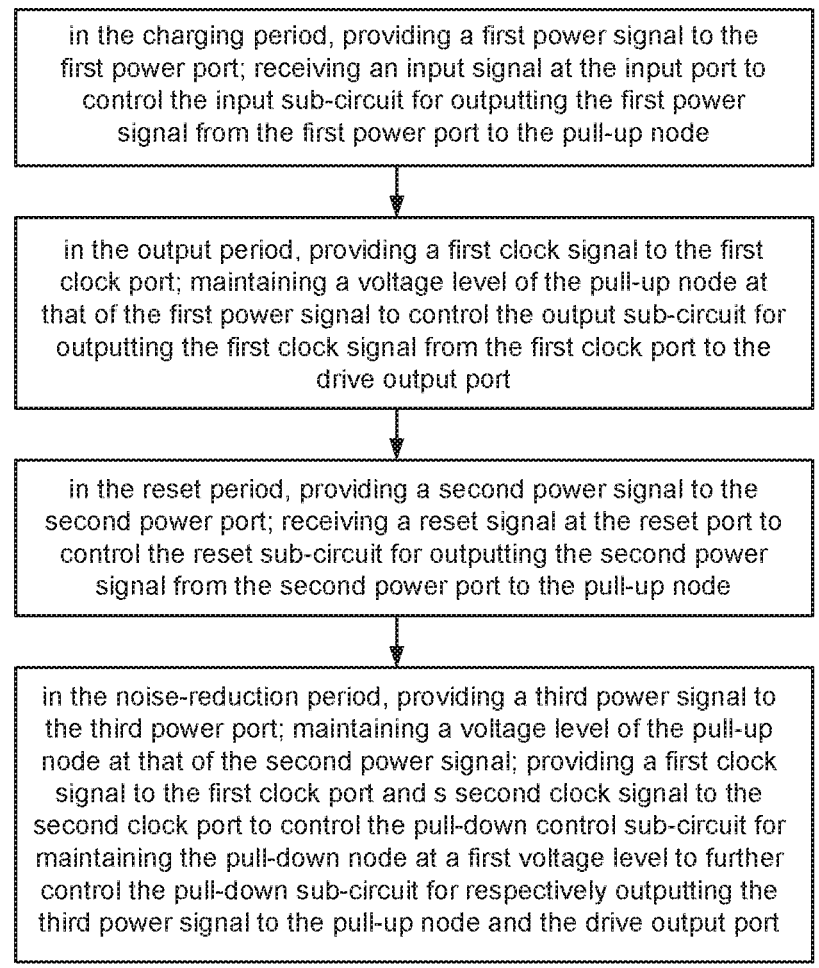
FIG. 4 is a flow chart showing a method of driving a shift-register circuit according to some embodiments of the present disclosure.

In another aspect, the present disclosure provides a method of driving the shift-register circuit described herein. FIG. 4 is a flow chart showing a method of driving a shift-register circuit according to some embodiments of the present disclosure. Here, the shift-register circuit can be one shown in FIG. 1 disposed in a display-touch panel as one shift-register unit including an input sub-circuit 10, a reset sub-circuit 20, an output sub-circuit 30, a pull-down control sub-circuit 40 and a pull-down sub-circuit 50. The shift register circuit can be one shown in FIG. 2 including further a compensation sub-circuit 60. The shift-register circuit is operated in an operation cycle for displaying a frame of image on the display-touch panel. The operation cycle includes at least a charging period, an output period, a reset period, and a noise-reduction period.

Referring to FIG. 4, the method includes, in the charging period, providing a first power signal to the first power port VDD; and receiving an input signal at the input port IN to control the input sub-circuit 10 for outputting the first power signal from the first power port VDD to the pull-up node PU. Optionally, the first power signal is set to a first voltage level which is a switch-on signal for the transistors in the shift-register circuit.

Referring to FIG. 4, the method further includes, in the output period, providing a first clock signal to the first clock port CLK; and maintaining a voltage level of the pull-up node PU at that of the first power signal to control the output sub-circuit 30 for outputting the first clock signal from the first clock port CLK to the output port OUT.

Referring to FIG. 4, additionally the method includes, in the reset period, providing a second power signal to the second power port VSS; receiving a reset signal at the reset port RST to control the reset sub-circuit 20 for outputting the second power signal from the second power port VSS to the pull-up node PU. Optionally, the second power signal is set to a second voltage level. Optionally, the second voltage level is a switch-off signal for the transistors in the shift-register circuit.

Referring to FIG. 4, furthermore, the method includes, in the noise-reduction period, providing a third power signal to the third power port VGL; maintaining a voltage level of the pull-up node PU at that of the second power signal; and providing a first clock signal to the first clock port CLK and a second clock signal to the second clock port CLKB to control the pull-down control sub-circuit 40 for maintaining the pull-down node PD at a first voltage level to further control the pull-down sub-circuit 50 for respectively outputting the third power signal to the pull-up node PU and the output port OUT. The third power signal from the third power port VGL is set to a second voltage level.

The display-touch panel, or display panel with touch control function, has been widely used. A typical touch panel is made by incorporating touch sensors full in cell together with the pixel elements thereof. For example, the touch sensors are disposed on a side of the array substrate of the full-in-cell display-touch panel to realize both touch control function and display function. The shift-register circuit used to drive the display panel for image display, on the one hand, provides drive signals sequentially from one row of subpixel units to another with a scanning frequency normally set to 60 Hz. Some advanced display-touch panel can be operated with a high scanning frequency (>60 Hz). The touch-control signal, on the other hand, is provided with a frequency much higher than 60 Hz. Thus, when the display-touch panel is displaying an image during which a touch-control signal is received, the touch-control signal may interfere with display signals. In order to prevent the interference between the display signals and the touch-control signals, the display-touch panel configured with high scanning frequency can control the shift-register circuit to halt the scanning operation while to store the drive signal outputted by the shift-register circuit during the reception of touch-control signal. After the touch-control signal is transmitted, the display-touch panel can control the shift-register circuit to re-start providing drive signal one row after another scanned through rest rows of subpixel units thereof. In other words, the touch-control signal is inserted in a non-display touch-scan period during an operation cycle of displaying one frame of image to avoid interference between the touch-control signal and the display signal. Alternatively, the display-touch panel configured with a scanning frequency of 60 Hz can receive the touch-control signal in a non-display touch-scan period after a full frame of image while before a next full frame of image. In other words, the touch-control signal is inserted between two frames of images to avoid interference between the touch-control signal and the display signal.

For display-touch panels including multiple shift-register circuits configured with scanning frequency higher than 60 Hz, referring to FIG. 2 and FIG. 3, each shift-register circuit further includes a compensation sub-circuit 60. During the operation cycle of driving the shift-register circuit, the method of driving the shift-register circuit includes additional operations in a first touch-scan period before the output period when a touch-control signal is received. In particular, the method includes providing a switch power signal from the switch power port SW at the first voltage level to control the pull-down sub-circuit 50 for outputting the third power signal at a second voltage level to the output port OUT and to control the compensation sub-circuit 60 for outputting the switch power signal to the pull-up node PU to maintain the pull-up node PU at the first voltage level. This provides compensation to the voltage level at the pull-up node PU and avoids voltage drop due to leakage of the pull-up node PU during the first touch-scan period for storing drive signal. At the same time, these additional operations reduce coupling between the switch power signal and the pull-up node PU of other shift-register circuits at other non-working rows nearby.

For display-touch panels including multiple shift-register circuits configured with normal scanning frequency of 60 Hz, the method of driving the shift-register circuit includes additional operations in a second touch-scan period after the noise-reduction period when a touch-control signal is received. In particular, the method includes providing the switch power signal at the first voltage level from the switch power port SW to control the pull-down sub-circuit 50 for outputting the third power signal at the second voltage level from the third power port VGL to the output port OUT. Since the voltage level of the output port OUT is pulled down to a low voltage level, interferences to the touch-control signal and drive signals at other working rows are substantially avoided.

Figure 5:
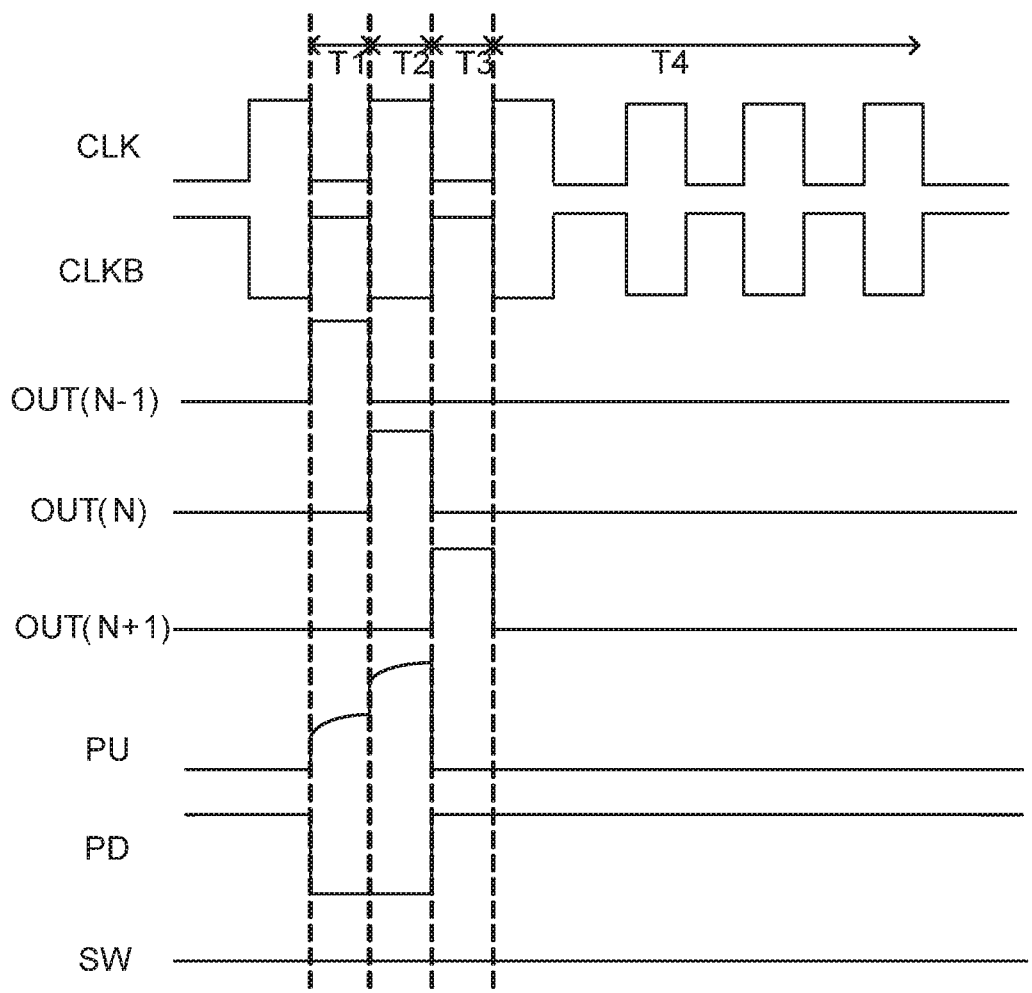
FIG. 5 is a timing waveform of driving a shift-register circuit in an operation cycle according to an embodiment of the present disclosure.

FIG. 5 is a timing waveform of driving a shift-register circuit in an operation cycle according to an embodiment of the present disclosure. In principle, the shift-register circuit is driven as one of multiple shift-register units cascaded in series in the display panel. One current stage (N) shift-register unit couples to a previous stage (N−1) shift-register unit and a next stage (N+1) shift-register unit. Merely as an example, FIG. 5 is used to illustrate the method of driving the shift-register circuit described herein. In the example, each shift-register unit is configured to be a same circuit shown in FIG. 3. Optionally, each transistor in the shift-register unit is N-type transistor. Optionally, the first voltage level is set to be a high voltage level relative to the second voltage level.

Referring to FIG. 5, in the charging period T1, the input signal received at the input port IN of the current stage (N) shift-register unit is a drive signal OUT(N−1) outputted from a previous stage (N−1) shift-register unit, which is at a high voltage level. Referring to FIG. 3, the ninth transistor M9 is turned on by the input signal to allow the first power signal (at the high voltage level) to pass from the first power port VDD to pull up the voltage level at the pull-up node PU.

The high voltage level at the pull-up node PU turns on the first transistor M and the eleventh transistor M11. The first clock port CLK outputs a first clock signal at a low voltage level to the output port OUT. The third power port VGL outputs a third power signal at the low voltage level to the pull-down node PD, which turns off the sixth transistor M6 and the seventh transistor M7. Since the switch power port SW also outputs a switch power signal at the low voltage level, the eighth transistor M8 also is turned off to prevent the voltage levels at the pull-up node PU and the output port OUT being affected by the third power signal, enhancing output signal stability.

In the output period T2, the pull-up node PU keeps its voltage level at the high voltage level. The first transistor M1, the fourth transistor M4, and the eleventh transistor M11 are turned on. Referring to FIG. 5, the first clock port outputs the first clock signal at the high voltage level in T2. Assisted by bootstrapping effect of the second capacitor C2, the voltage level at the pull-up node PU is pushed higher, making the eleventh transistor M11 a full conductor to allow the first clock signal (at the high voltage level) to be outputted to the output port OUT for driving one rows of subpixel units of the display panel. At the same time, the third power port VGL outputs the third power signal (at the low voltage level) to the pull-down node PD and the switch power port SW outputs the switch power signal (also at the low voltage level) to the gate of the fifth transistor M5. Thus the third transistor M3, the fifth transistor M5, and the eighth transistor M8 are turned off to ensure output signal stability. In an implementation, by adjusting the width-length ratio of the first transistor M1 and the sixth transistor M6, the third power port VGL can effectively pull down voltage level at the pull-down node PD when the pull-up node is at the high voltage level to ensure that the sixth transistor is completely turned off.

In the reset period T3, the reset port RST of the current stage (N) shift-register unit outputs a reset signal that is coming from the drive signal OUT(N+1) outputted from the next stage (N+1) shift-register unit. Referring to FIG. 5, the drive signal OUT(N+1) is a signal at the high voltage level that turns on the tenth transistor M10. The second power port VSS outputs the second power signal at the low voltage level to the pull-up node PU to reset its voltage level to low voltage. Now, the first transistor M1, the fourth transistor M4, and the eleventh transistor M11 are turned off. No drive signal is outputted from the output port OUT.

In the noise-reduction period T4, the switch power signal from the switch power port SW is a low voltage signal. The first clock signal and the second clock signal are alternatively set to the high voltage level. When the first clock signal from the first clock port CLK is set to a high voltage level, the first capacitor C1 pulls up the pull-down node PD to the high voltage level. Thus, the sixth transistor M6, the seventh transistor M7, and the third transistor M3 are turned on. The third power port VGL respectively outputs the third power signal (at the low voltage level) to the pull-up node PU, the output port OUT, and the gate of the fifth transistor M5. The low voltage level thereof helps to reduce noises at the pull-up node PU and the drive output OUT. When the second clock signal from the second clock port CLKB is at a high voltage level, the second transistor M2 is turned on and the second clock signal is passed to the pull-down node PD to make it at the high voltage level too. The pull-down sub-circuit 50 continues to reduce noises at the pull-up node PU and the output port OUT by keeping their voltage level low.

Before scanning for displaying a next frame of image, the shift-register unit may continue to repeat the method performed in the noise-reduction period. Referring to FIG. 5, the voltage level at the pull-down node PD can be kept at the high voltage level so that the pull-down sub-circuit 50 can continue to operate to pull down voltage levels at the pull-up node PU and the output port OUT. The method performed during the above noise-reduction period can make substantially eliminate the noise voltage signals at the output port OUT generated by coupling with the first clock port CLK when the shift-register unit is outputting a low voltage signal during the second touch-scan period.

Figure 6:
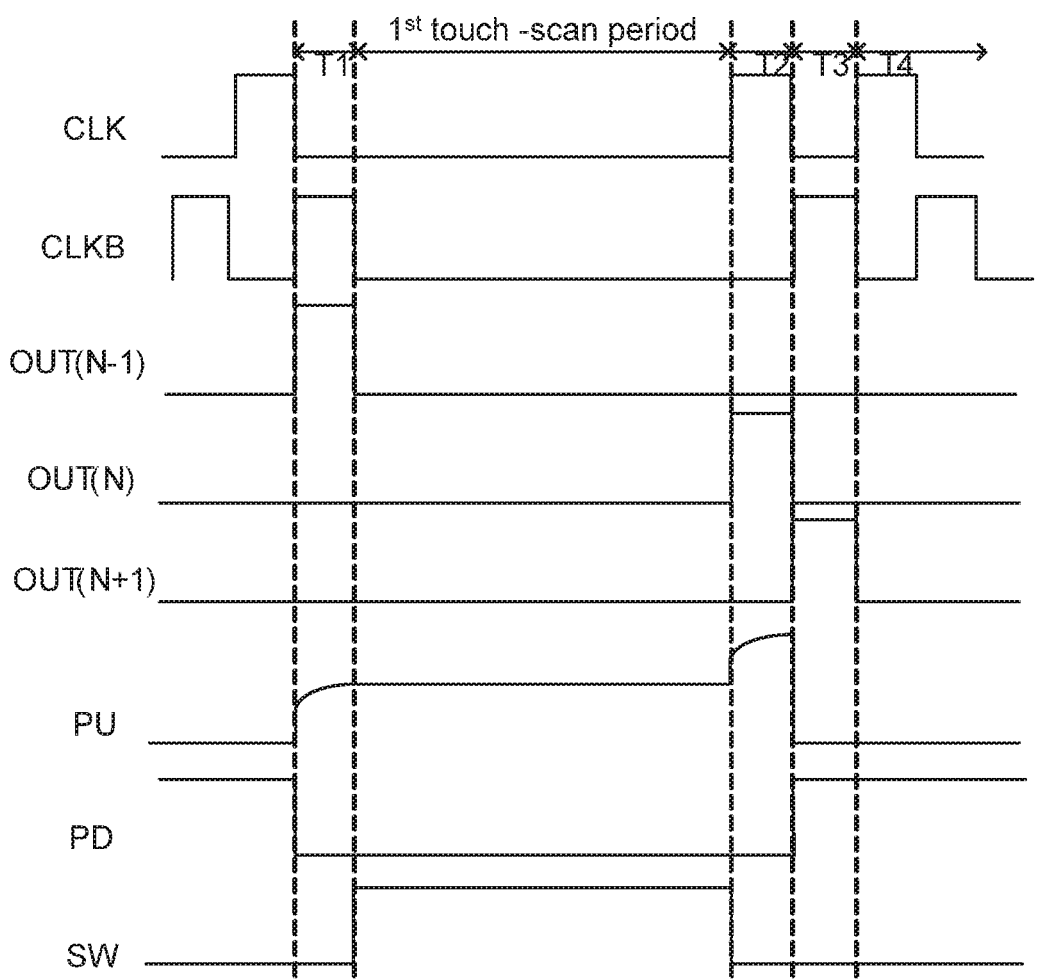
FIG. 6 is a timing waveform of driving another shift-register circuit in an operation cycle according to another embodiment of the present disclosure.

FIG. 6 is a timing waveform of driving shift-register circuit in an operation cycle according to another embodiment of the present disclosure. Referring to FIG. 6, the method of driving the shift-register circuit is associated with operations when a touch-control signal is introduced during a scanning operation for outputting a drive signal to drive a row of subpixel units of the display panel for displaying one frame of image. When a touch-control signal is received in a first touch-scan period, a non-display period before the output period T2, the method includes outputting a switch power signal at high voltage level from the switch power port SW; providing a first clock signal from the first clock port CLK and a second clock signal from the second clock port CLKB, both being at a low voltage level. Referring to FIG. 3, the eighth transistor M8 will be turned on under such voltage setting condition above. In the first touch-scan period, the third power port VGL outputs the third power signal at low voltage level to the output port OUT to pull down the voltage level at the output port to avoid its interference to the touch-control signal, enhancing touch-control effect of the display-touch panel. Since the pull-up node PU still is kept at the high voltage level, the fourth transistor M4 is turned on. The switch power port SW outputs the switch power signal (at the high voltage level) to the gate of the fifth transistor M5 to turn M5 on. The switch power port SW also outputs the high voltage level to the pull-up node PU to charge the second capacitor C2 for maintaining the pull-up node at the high voltage level.

Figure 7:
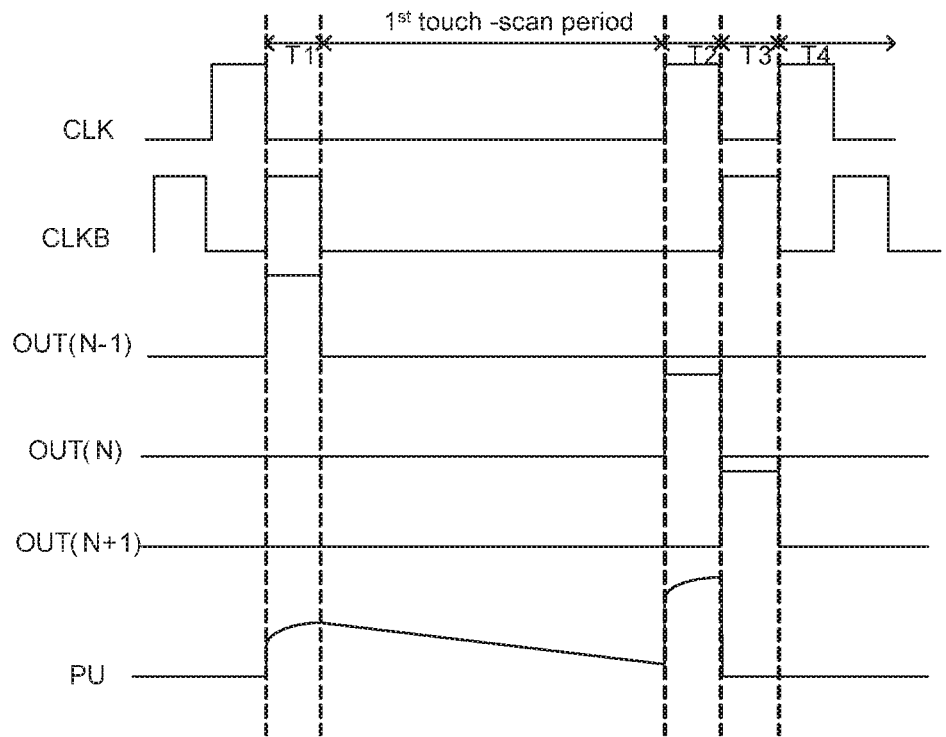
FIG. 7 is a timing waveform of driving a conventional shift-register circuit in an operation cycle.

FIG. 7 is a timing waveform of driving a conventional shift-register circuit in an operation cycle. As seen in FIG. 7, in the first touch-scan period the voltage level at the pull-up node PU may be gradually pulled down due to leakage currents through the sixth transistor M6 and the seventh transistor M7 of the conventional shift-register circuit without the compensation sub-circuit. The lowered voltage level at the pull-up node results in no drive signal being outputted from the output port or merely outputting a drive signal with a voltage level too low. But referring to the timing waveform shown in FIG. 6 for operating the shift-register circuit of the present disclosure, the compensation sub-circuit 60 can make compensation to the voltage level at the pull-up node PU during the first touch-scan period. This ensures that after the touch-scan period the current stage shift-register unit can resume its function of outputting drive signal normally in the output period T2. At the same time, the voltage levels of other pull-up nodes of other stages shift-register units in other non-working rows are all in low voltage level. Therefore, the compensation to the pull-up node at the current row will not cause interference to other stage shift-register units in scanning subsequent rows for displaying one frame of image within the operation cycle. When the first touch-scan period ends, the switch power port SW outputs a switch power signal at the low voltage level and the current stage shift-register unit can continue to perform its operation in the output period T2.

Since the voltage levels of the other pull-down node PD of other shift-register units in other non-working rows are kept at the high voltage level during the first touch-scan period, the pull-down sub-circuit thereof is configured to pull down the voltage level at the pull-up node PU and the output port thereof. Therefore, the third transistor M3 of the other shift-register unit in non-working row is turned on to connect the third power port with the gate of the fifth transistor M5 thereof. The third power signal is set to the low voltage level to prevent the switch power signal from the switch power port from coupling with the pull-up node of other shift-register unit. Again, this enhances the display performance of the display-touch panel.

For the display-touch panel configured with a scanning frequency of 60 Hz, if a touch-control signal is introduced in a non-display touch-scan period between two frames of images, i.e., after the noise-reduction period of scanning a frame of image before scanning the next frame of image. The method of driving the shift-register circuit includes, in a second touch-scan period, outputting a switch power signal at the high voltage level from the switch power port SW to turn on the eighth transistor M8. Further the method includes outputting the third power signal at the low voltage level from the third power port VGL to the output port OUT.

Optionally, the second touch-scan period above can be substantially a V-blank period of the display-touch panel, which is time duration after scanning one frame of image and before scanning a next frame of image. For a display panel configured with a scanning frequency of 60 Hz and incorporated with touch sensors full in cell, the touch-control signals can be provided during the V-blank period. In the present disclosure, within the second touch-scan period, the third power port VGL can provides the third power signal at the fixed low voltage level to the output port to achieve noise reduction at the output port and prevent interference to the touch-control signal from the drive signal.

Figure 8:
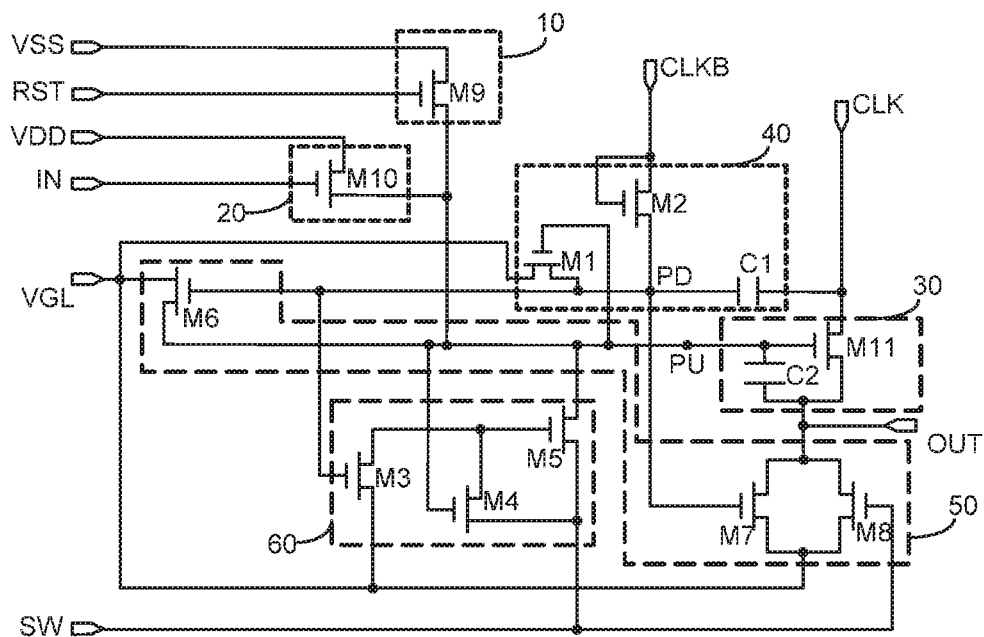
FIG. 8 is a circuit diagram of a shift-register circuit according to another embodiment of the present disclosure.

Optionally, the shift-register circuit described hereabove (FIG. 3) is one of multiple shift-register units coupled in a cascaded series in a display panel. A method of driving the display panel for displaying one frame of image includes operating the cascaded series of shift-register units to drive each of the multiple shift-register units for outputting a drive signal via the corresponding output port sequentially in a forward direction of the cascaded series. FIG. 8 is a circuit diagram of a shift-register circuit according to another embodiment of the present disclosure. Comparing with FIG. 3, the shift-register circuit shown in FIG. 8 is configured to be substantially the same as the shift-register circuit of FIG. 3 except that the first power port and the second power port are interchanged and the input port and the reset port are interchanged. Thus, the ninth transistor M9 becomes a reset transistor in the reset sub-circuit and the tenth transistor M10 becomes a charging transistor in the input sub-circuit. After cascading multiple shift-register units of FIG. 8 in the display panel, the method of driving the display panel for displaying one frame of image includes operating the cascaded series of shift-register units to drive each of the multiple shift-register units for outputting a drive signal via the corresponding output port sequentially in a backward direction. Alternative, the method of driving the display panel having the cascaded series of shift-register units of FIG. 3 can also be operated in the backward direction by outputting a second voltage level (instead of the first voltage level) from the first power port VDD and outputting a first voltage level (instead of the second voltage level) from the second power port VSS.

Optionally, in the embodiments described above (FIG. 1 through FIG. 6 and FIG. 8), all transistors in each sub-circuit of the shift-register circuit are N-type transistors. Correspondingly, the first voltage level is set to a high voltage level relative to the second voltage level. Optionally, all those transistors can be P-type transistors and correspondingly the first voltage level is set to a low voltage level relative to the second voltage level. In this case, all voltage level changes in various signal ports are reversed from those shown in FIG. 5 and FIG. 6.

Figure 9:
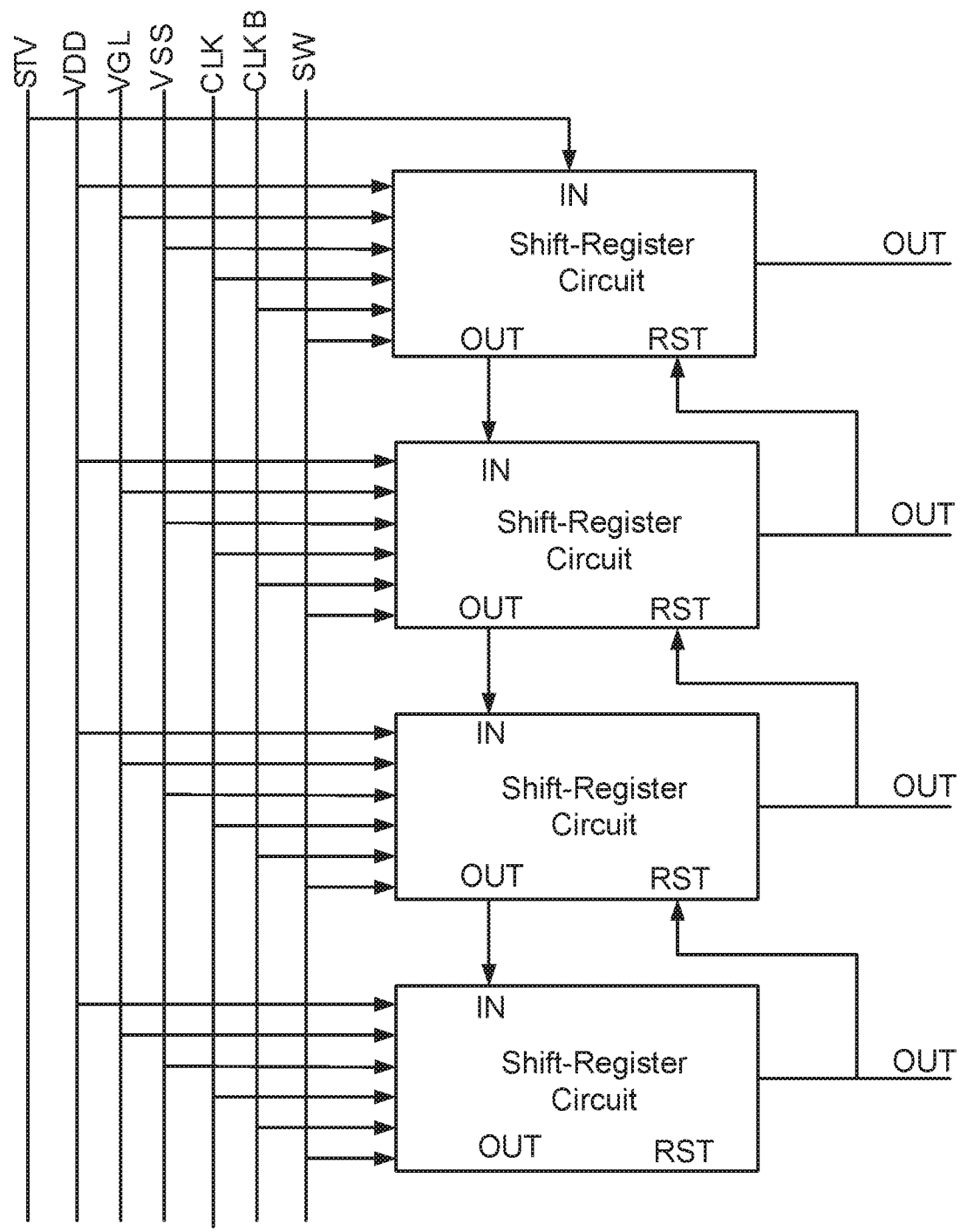
FIG. 9 is a schematic diagram of a gate-driving circuit according to some embodiments of the present disclosure.

In another aspect, the present disclosure provides a gate-driving circuit including multiple shift-register units in a cascaded series and each shift-register unit is a shift-register circuit described herein. FIG. 9 is a schematic diagram of a gate-driving circuit according to some embodiments of the present disclosure. Referring to FIG. 9, the gate-driving circuit includes multiple (or at least two) shift-register units coupled in a cascaded series. Each shift-register unit can be a shift-register circuit shown in FIG. 1, FIG. 2, FIG. 3, or FIG. 8. In the cascaded series, each stage shift-register unit has an input port IN coupled to an output port OUT of a previous stage shift-register unit and a reset port RST coupled to an output port OUT of a next stage shift-register unit. A first stage shift-register unit includes an input port IN coupled to a frame-starting terminal STV.

In yet another aspect, the present disclosure provides a display panel including touch sensors embedded full-in-cell therein and the gate-driving circuit described herein for displaying one frame of image in an operation cycle with a scanning frequency equal to or greater than 60 GHz and performing a touch-control in a touch-scan period before an output period within each operation cycle.

In still another aspect, the present disclosure provides a display apparatus comprising a display panel described herein. The display apparatus can be one of liquid crystal display panel, electronic paper, OLED display panel, AMOLED display panel, smart phone, tablet computer, TV, displayer, notebook computer, digital picture frame, navigator, and any product or component having a display function.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift-register circuit comprising:
   an input sub-circuit coupled to an input port, a first power port, and a pull-up node, the input sub-circuit being configured to pull up a voltage level at the pull-up node under control of an input signal from the input port and a first power signal at a first voltage level from the first power port;
   an output sub-circuit coupled to a first clock port, the pull-up node, and an output port, the output sub-circuit being configured to output a first clock signal from the first clock port to the output port under control of the voltage level at the pull-up node;
   a reset sub-circuit coupled to a reset port, a second power port, and the pull-up node, the reset sub-circuit being configured to reset the voltage level at the pull-up node based on a reset signal from the reset port and a second power signal at a second voltage level from the second power port;
   a pull-down control sub-circuit coupled to the pull-up node, a pull-down node, a third power port, a second clock port, and the first clock port, the pull-down control sub-circuit being configured to control a voltage level at the pull-down node based on the voltage level at the pull-up node, a third power signal at the second voltage level from the third power port, a second clock signal from the second clock port, and the first clock signal;
   a pull-down sub-circuit coupled to the pull-down node, the pull-up node, the third power port, a switch power port, and the output port, the pull-down sub-circuit being configured to pull down the voltage level at the pull-up node and the output port under control of the third power signal at the second voltage level and a switch power signal from the switch power port;
   a compensation sub-circuit coupled to the pull-up node, the pull-down node, the third power port, and the switch power port, the compensation sub-circuit being configured to compensate the voltage level of the pull-up node under control of the voltage level at the pull-down node, the third power signal, and the switch power signal;
   wherein the pull-down control sub-circuit comprises a first transistor, a second transistor, and a first capacitor, wherein a gate of the first transistor is coupled to the pull-up node, a first electrode of the first transistor is coupled to the third power port, and a second electrode of the first transistor is coupled to the pull-down node;
   a gate and a first electrode of the second transistor are both coupled to the second clock port, and a second electrode of the second transistor is coupled to the pull-down node; and
   a first electrode of the first capacitor is coupled to the first clock port and a second electrode of the first capacitor is coupled to the pull-down node;
   the compensation sub-circuit comprises a third transistor, a fourth transistor, and a fifth transistor, wherein a gate of the third transistor is coupled to the pull-down node, a first electrode of the third transistor is coupled to the third power port; a gate of the fourth transistor is coupled to the pull-up node, a first electrode of the fourth transistor is coupled to the switch power port; and a gate of the fifth transistor is coupled to a second electrode of the third transistor and a second electrode of the fourth transistor, a first electrode of the fifth transistor is coupled to the switch power port, and a second electrode of the fifth transistor is coupled to the pull-up node; and
   the pull-down sub-circuit comprises a sixth transistor, a seventh transistor, and an eighth transistor, wherein a gate of the sixth transistor is coupled to the pull-down node, a first electrode of the sixth transistor is coupled to the third power port, and a second electrode of the sixth transistor is coupled to the pull-up node; a gate of the seventh transistor is coupled to the pull-down node, a first electrode of the seventh transistor is coupled to the third power port, and a second electrode of the seventh transistor is coupled to the output port; and a gate of the eighth transistor is coupled to the switch power port, a first electrode of the eighth transistor is coupled to the third power port, and a second electrode of the eighth transistor is coupled to the output port.

2. The shift-register circuit of claim 1, wherein the input sub-circuit comprises a ninth transistor having a gate coupled to the input port, a first electrode coupled to the first power port, and a second electrode coupled to the pull-up node.

3. The shift-register circuit of claim 1, wherein the reset sub-circuit comprises a tenth transistor having a gate coupled to the reset port, a first electrode coupled to the second power port, and a second electrode coupled to the pull-up node.

4. The shift-register circuit of claim 1, wherein the output sub-circuit comprises an eleventh transistor and a second capacitor; wherein
   a gate of the eleventh transistor is coupled to the pull-up node, a first electrode of the eleventh transistor is coupled to the first clock port, and a second electrode of the eleventh transistor is coupled to the output port; and
   a first electrode of the second capacitor is coupled to the pull-up node and a second electrode of the second capacitor is coupled to the output port.

5. The shift-register circuit of claim 1, wherein each of the first transistor, the second transistor, the third transistor, the fourth transistor, the fifth transistor, the sixth transistor, the seventh transistor, the eighth transistor, is an N-type transistor, and the first voltage level is higher than the second voltage level.

6. A gate-driving circuit comprising multiple shift-register units in a cascaded series, each shift-register unit being a shift-register circuit of claim 1.

7. A display-touch panel comprising:
   touch sensors embedded full-in-cell, and
   the gate-driving circuit of claim 6, for displaying one frame of image in an operation cycle with a scanning frequency and performing a touch-control in a touch-scan period within each operation cycle before an output period.

8. A display apparatus comprising a display-touch panel of claim 7.

* * * * *